(12) United States Patent
Roesner et al.

(10) Patent No.: US 9,277,680 B2
(45) Date of Patent: Mar. 1, 2016

(54) BLADE COMPUTER SYSTEM

(75) Inventors: Arlen L. Roesner, Fort Collins, CO (US); Russ W. Herrell, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 271 days.

(21) Appl. No.: 14/005,279

(22) PCT Filed: May 25, 2011

(86) PCT No.: PCT/US2011/037982
§ 371 (c)(1),
(2), (4) Date: Sep. 16, 2013

(87) PCT Pub. No.: WO2012/161712
PCT Pub. Date: Nov. 29, 2012

(65) Prior Publication Data
US 2014/0002988 A1    Jan. 2, 2014

(51) Int. Cl.
*H05K 7/20*    (2006.01)
*G06F 1/20*    (2006.01)
*H01L 23/473*    (2006.01)

(52) U.S. Cl.
CPC .............. *H05K 7/20754* (2013.01); *G06F 1/20* (2013.01); *H05K 7/20736* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723, 724–727; 165/80.1–80.5, 165/104.33, 185; 174/15.1–15.3, 174/16.1–16.3, 547, 548; 257/712–722, 257/E23.088; 24/453, 458–459; 454/184; 312/236
See application file for complete search history.

(56) References Cited

U.S. PATENT DOCUMENTS 6,741,463 B1 *  5/2004  Akhtar ................. G06F 1/1632
                                                      312/223.1
7,113,401 B2     9/2006  Becker
7,139,170 B2    11/2006  Chikusa (Continued)

FOREIGN PATENT DOCUMENTS

KR           100772084 B1    10/2007

OTHER PUBLICATIONS

IPO, Office Action mailed May 26, 2015, GB App No. 1315512.2, 3pps.

(Continued)

*Primary Examiner* — Anthony Haughton
*Assistant Examiner* — Razmeen Gafur
(74) *Attorney, Agent, or Firm* — Rathe Lindenbaum LLP

(57) ABSTRACT

A blade computer system comprises side-by-side computer blades (44, 144), a connectivity module (50, 150, 350) extending across and connected to each of the plurality of side-by-side computer blades (44, 144) along the ends of the computer blades (44, 144) and at least one first power supply-fan unit (46, 146) extending perpendicular to the first axis and directly connected to each of the first plurality of side-by-side computer blades (44, 144) along ends of the plurality of side-by-side computer blades (44, 144) such that the at least one power supply-fan unit (46, 146) draws air across the first plurality of side-by-side computer blades (44, 144) and into the first connectivity module (50, 150, 350).

15 Claims, 9 Drawing Sheets

(56) References Cited

U.S. PATENT DOCUMENTS

| | | | |
|---|---|---|---|
| 7,256,995 B2* | 8/2007 | Wrycraft | H05K 7/1488 361/695 |
| 7,350,090 B2 | 3/2008 | Baurer et al. | |
| 7,675,748 B2 | 3/2010 | Matsushima | |
| 7,916,471 B2* | 3/2011 | Miyamoto | G11B 33/128 361/679.31 |
| 8,441,788 B2* | 5/2013 | Xu | G06F 1/181 361/679.46 |
| 8,441,793 B2* | 5/2013 | Dunwoody | H05K 7/1492 165/104.26 |
| 8,477,491 B1* | 7/2013 | Ross | H05K 7/20736 361/679.48 |
| 8,526,182 B2* | 9/2013 | Chen | H05K 7/20736 165/104.33 |
| 8,743,551 B2* | 6/2014 | Wang | G06F 1/185 361/727 |
| 8,879,241 B2* | 11/2014 | Lu | G06F 1/181 174/149 B |
| 2002/0036894 A1* | 3/2002 | Robbins | G06F 1/183 361/727 |
| 2003/0030975 A1* | 2/2003 | Bestwick | G06F 1/183 361/679.51 |
| 2003/0081386 A1 | 5/2003 | Robillard | |
| 2004/0032722 A1* | 2/2004 | Wrycraft | H05K 7/1488 361/725 |
| 2004/0062002 A1* | 4/2004 | Barringer | G06F 1/18 361/679.4 |
| 2004/0165358 A1* | 8/2004 | Regimbal | H05K 7/1498 361/727 |
| 2004/0184233 A1* | 9/2004 | Yamada | H05K 7/20572 361/690 |
| 2005/0015531 A1 | 1/2005 | Yabuta | |
| 2005/0083651 A1 | 4/2005 | Smith | |
| 2005/0146855 A1* | 7/2005 | Brehm | H05K 7/1454 361/724 |
| 2006/0039108 A1* | 2/2006 | Chikusa | G06F 1/20 361/695 |
| 2006/0056142 A1* | 3/2006 | Takahashi | G06F 1/30 361/679.33 |
| 2007/0133167 A1* | 6/2007 | Wagner | H05K 7/20727 361/679.4 |
| 2008/0239648 A1* | 10/2008 | Okamoto | G06F 1/183 361/725 |
| 2008/0239689 A1 | 10/2008 | Okamoto et al. | |
| 2008/0253085 A1* | 10/2008 | Soffer | G06F 1/18 361/679.4 |
| 2008/0259555 A1* | 10/2008 | Bechtolsheim | G06F 13/409 361/679.4 |
| 2009/0016010 A1 | 1/2009 | Vinson | |
| 2009/0094594 A1 | 4/2009 | Walker | |
| 2009/0260384 A1 | 10/2009 | Champion | |
| 2010/0073866 A1* | 3/2010 | Toyoda | F28D 15/043 361/679.47 |
| 2010/0172087 A1* | 7/2010 | Jeffery | G11B 33/02 361/679.33 |
| 2011/0058334 A1* | 3/2011 | Takemoto | H05K 7/20172 361/695 |
| 2012/0320533 A1* | 12/2012 | Zhang | H05K 7/1489 361/726 |

OTHER PUBLICATIONS

T. Brey, et al; BladeCenter Chassis management, IBM J. Res. & Dev. vol. 49 No. 6, Nov. 2005.

IBM: BladeCenter S (8886), http://www-03.ibm.com/systems/xbc/cog/bc_s_8886/bc_s_8886aag.html;May 26, 2011.

Kevin Leigh, et al; Blades as a General-Purpose Infrastructure for Future System Architectures; Challenges and Solutions; HP Lab; HPL-206-182; Jan. 4, 2007.

David Watts, et al; IBM BladeCenter Products and Technology, Red paper; International Technical Support Organization, Feb. 16, 2007.

Oracle; Sun Blade 6000 Modular Systems from Oracle, Oracle White PaperSun; Jun. 2010.

* cited by examiner

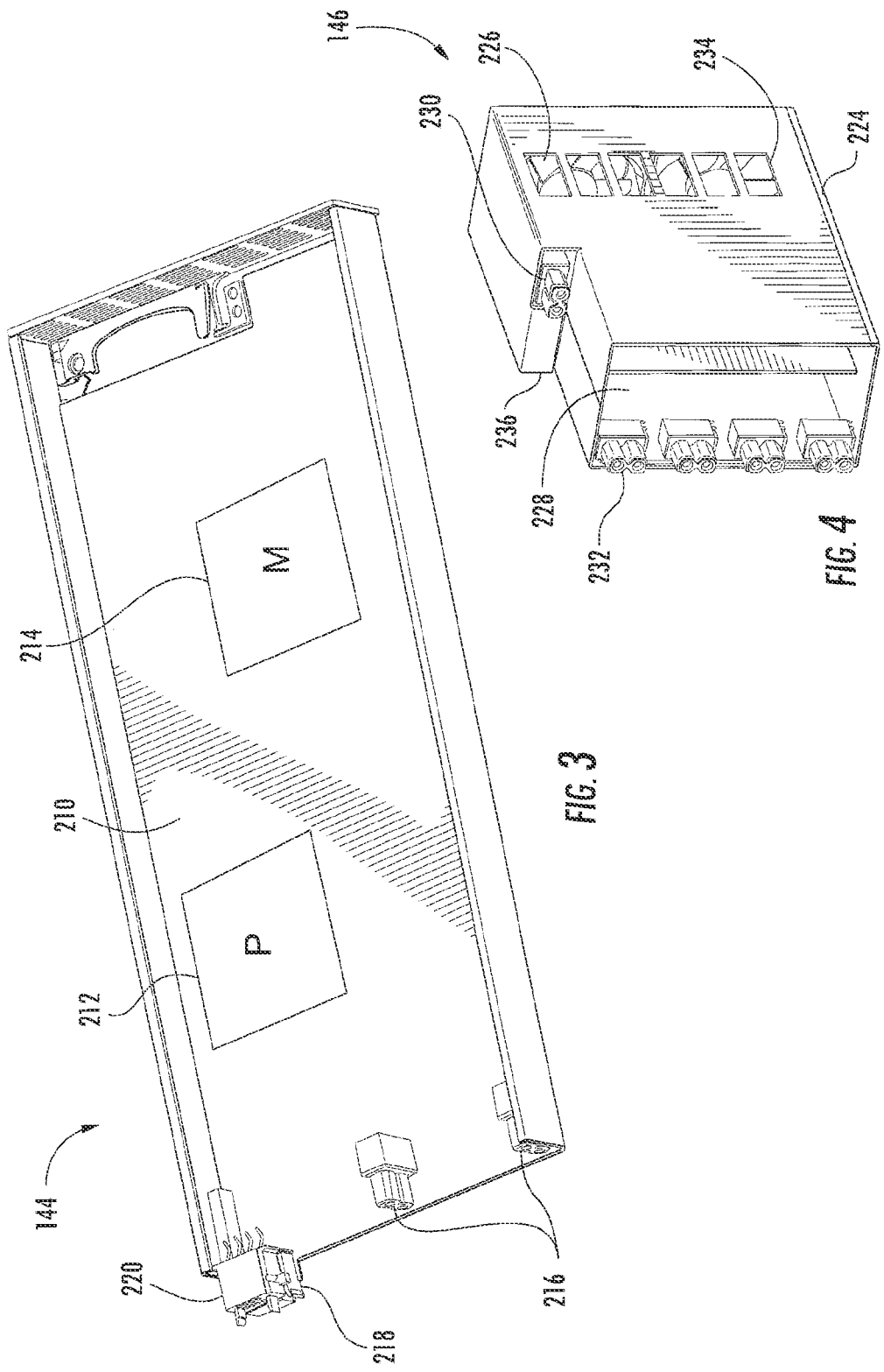

BLADE COMPUTER SYSTEM

BACKGROUND

Some blade computer systems utilize a centrally located printed circuit assembly midplane to connect the blades to interconnect switches and management circuitry. Such printed circuit assembly midplanes reduce architectural flexibility and impede airflow across the interconnect switches and management circuitry.

BRIEF DESCRIPTION OF THE DRAWINGS

FIG. 3 the top perspective view of an example blade of the blade system of FIG. 2.

FIG. 4 is a top perspective view of an example power supply-fan unit of the blade system of FIG. 2.

DETAILED DESCRIPTION OF THE EXAMPLE EMBODIMENTS

Figure 1:
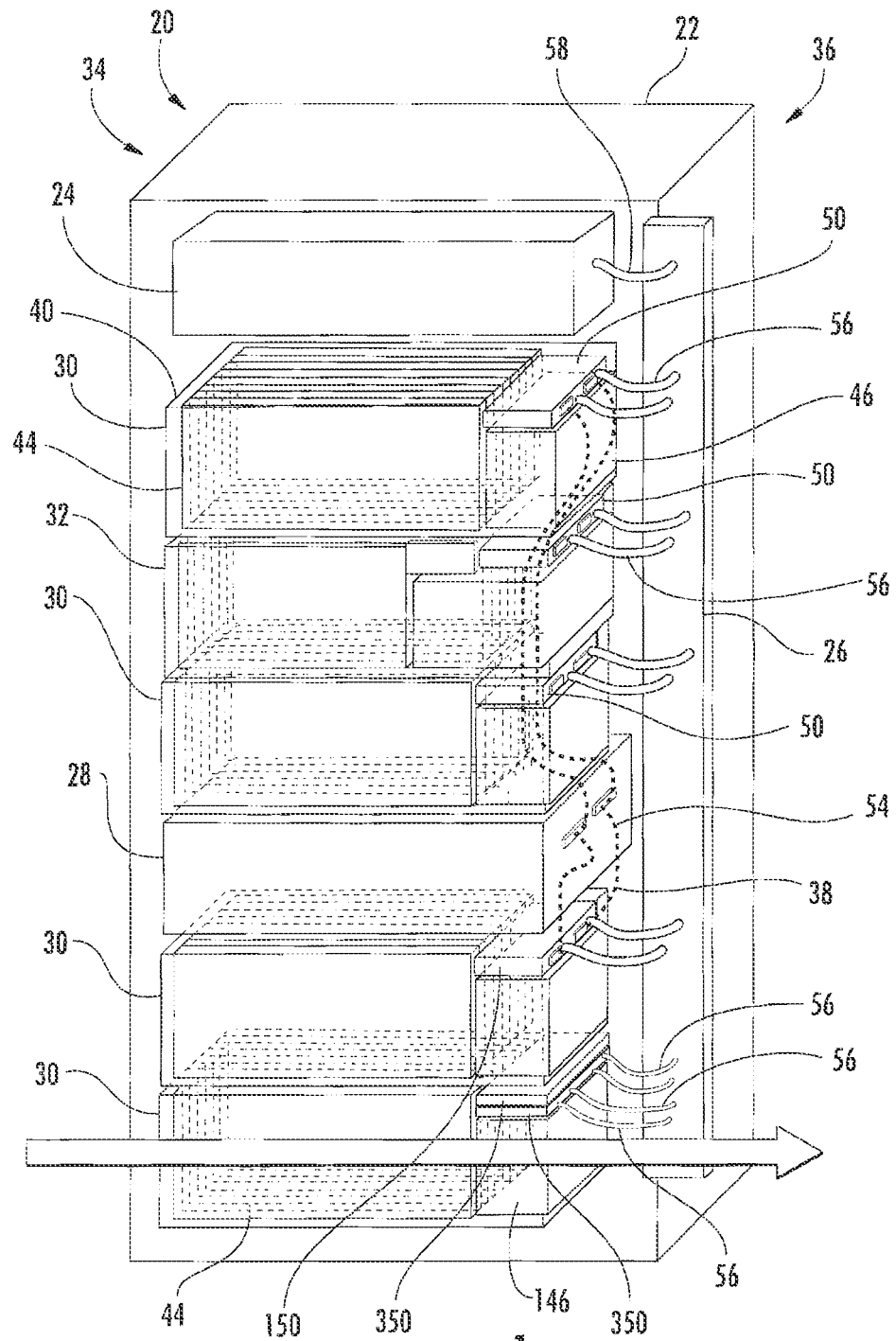
FIG. 1 is aside perspective view schematically illustrating a computer system according to an example embodiment.

FIG. 1 schematically illustrates computer system 20 according to an example embodiment. As will be described hereafter, blade computer system 20 provides more direct unidirectional airflow for enhanced cooling of its components. Blade computer system 20 further provides architectural flexibility. Computer system 20 comprises rack 22, rack switches 24, optical pillar 26, mass storage device 28, deep blade systems 30 and short blade systems 32.

Rack 22 comprises a frame, housing or enclosure configured to support the remaining components of blade computer system 20. In particular, rack 22 is configured to support rack switch 24 and pillar 26 while supporting removable mass storage device 28 and blade systems 30, 32. Rack 22 has a front 34 and an opposite rear 36. In the example illustrated, the blades of blade systems 30, 32 are accessible from the front 34 of rack 22 which is positioned adjacent a "cold aisle" of a data center. Although rack 22 is illustrated as supporting and enclosing one mass storage device 28 and five vertically arranged blade systems 30, 32, in other embodiments, rack 22 may have other configurations so as to support or enclose a greater or fewer number of such components or so as to support one or more additional or alternative components.

Rack switches 24, also known as rack interconnects, comprise one or more electronic devices providing switching devices for the blades of blade systems 30, 32. Examples of such switching devices include networking and storage fabric switches. In the example illustrated, rack switch comprises a top-of-rack Ethernet switch product commercially available from Hewlett Packard Company (ie: Procurve product line). In other embodiments, rack switches 24 may comprise other devices or have other configurations. In some embodiments, rack switches 24 may be omitted.

Optical pillar 26 comprises an optical patch panel or optical manifold facilitating optical connection between each of blade systems 30, 32 and rack switches 24. In the example illustrated, optical pillar 26 vertically extends along a majority, if not substantial portion, of a height of rack 22, spanning each of blade systems 30, 32. In the example illustrated, optical pillar 26 comprises a sheet metal enclosure containing multiple optical fibers and multiple panel-mounted optical connectors such as those used with MTP (multi-fiber termination push-on) optical cables, such as those available commercially from Molex at 2222 Wellington. Court, Lisle, Ill. 60532-1682. In other embodiments, optical pillar 26 may comprise other types of patches or may have other configurations for different rack level interconnects. In some embodiments, optical pillar 26 may be omitted.

Mass storage device 28 is an example of a low total bandwidth device which is configured to operate using low total bandwidth communication. In the example illustrated, mass storage device is an array of storage devices (ie: hard drives) contained in an integrated storage product, configured for use by or configured to work with one or more of blade systems 30, 32. In the example illustrated, mass storage device 28 communicates with one or more blade systems 30, 32 by electrical communication cables 38, such as copper cables, for intra-rack connectivity at a low speed or bandwidth. In one embodiment, mass storage device 28 comprises a network attached storage (NAS) or storage area network (SAN) storage for booting the blades of blade systems 30, 32. In other embodiments, mass storage device 28 may comprise other similar devices.

Blade systems 30, 32 comprise units or systems configured to save space and power consumption while providing functional components of a computer. Each blade system 30, 32 comprises enclosure 40, multiple blade servers or blades 44, at least one power supply-fan unit 46, and one or more connectivity modules 50. Enclosures 40 support and hold blades 44, power supply and fan unit 46 and connectivity module(s) 50. Enclosures 40 are configured to removably mount or be field mountable within rack 22 and include one or more vent openings through which air may be drawn through enclosures 40 and one more access panels by which blades 44 may be accessed.

Blades 44, sometimes referred to as "high density servers" or "blade servers" comprise thin modular electronic circuit boards containing one or more microprocessors and memory. In particular, each blade is a single self-contained computer-motherboard, processor, memory and connectivity configured to be secured into a slot in rack 22. Each blade shares one or more power supply and fan units 46. Each blade also shares at least one connectivity module 50.

As shown by FIG. 1, each of the blades 44 of blade systems 30, 32 are supported in a side-by-side arrangement such that each of blades 44 is substantially contained in a vertical plane. Blades 44 are further arranged such that each blade has a major dimension (the largest of the three dimensions of each blade) extending along the horizontal axis. Because blades 44 are arranged in a side-by-side arrangement such that their major dimensions extend along a horizontal axis, cooling airflow across such blades in a front to rear direction (from side 34 to side 36) is enhanced.

Power supply-fan units 46 comprise one or more modules supported by enclosure 40 at an end of blades 40. For example, one embodiment, the blade system 30, 32 may include a single power supply-fan unit spanning all of its blades 44. In another embodiment, a particular blade system 30, 32 may include multiple power supply-fan units 46 which collectively span all of its blades 44.

Each power supply-fan unit 46 comprises a module configured as a single contained unit which provides both electrical power and cooling airflow to their associated blade systems 30, 32. In particular, each power supply-fan unit 46 provides electrical power to its associated blades 44 and connectivity module 50 contained or supported by the same enclosure 44. Each power supply-fan unit 46 further includes one or more motor driven fans or blowers configured to draw air through and across heat generating components of blades 44 and across heat generating components of connectivity module 50 to cool such heat generating components.

As shown by FIG. 1, each power supply-fan unit 46 extends perpendicular to the axis along which the major dimension of each of blades 44 extends. Each power supply-fan unit 46 is directly connected to each of a plurality of the side-by-side blades 44 along ends of blades 44 such that each power supply-fan unit 46 draws air across the planar faces of blades 44 and through the fans of unit 44. Because each power supply fan unit 46 is directly connected to each of the side-by-side blades: (1) cooling airflow across blades 44 is more efficient and direct; and (2) architectural flexibility is increased.

First, airflow across blades 44 is more efficient and direct since there are fewer obstructions or no intervening structures between the one or units 46 and blades 44 about which the air must flow when being drawn by units 46 from side 34 to side 36. For example, air may flow across blades 44 and either into and out of unit 46, or through connectivity module 50 and into and out of unit 46, without the air having to divert its flow path around airflow impeding structures such as electrical midplanes or backplanes having a planar area that spans across multiple blades or that covers or blocks 25% or more of the total area of the airflow openings or gaps at the ends of blades 44 facing units 46.

Second, architectural flexibility is enhanced since blades 44 are directly connected to power supply-fan units 46. Because each blade system 30, 32 omits a fixed-in-enclosure midplane or backplane, a single enclosure 40 may be used for differing product families that may have different space needs between blades 44 and connectivity module 50 or different power demands. For example, blades 44 may be made deeper with units 46 and connectivity module 50 being made shorter. Various combinations of blade, power supply and fan unit 46 and connectivity module 50 can be designed for differing environments (scalable server blades versus storage blades) all of which fit into the same enclosure 40. The shorter blade may lower cost by reducing printed circuit board size, while the same time, a deeper power supply and tan unit 46 may be utilized to lower-cost by allowing a lower density power supply to be employed.

FIG. 1 illustrates an example of such architectural flexibility. As shown by FIG. 1, blade systems 30 each include deep blades whereas blade system 30 includes short blades 44. In other words, the major dimension of blades 44 of blade systems 30 is larger than the major dimension of blades 44 of blade system 32. Likewise, blade systems 30 employee a shorter power supply-fan unit 46 whereas blade system 32 employs a deeper power supply-fan unit 46. In one embodiment, the deeper blades 44 of blade systems 30 may include additional components as compared to blades 44 of blade system 32 and the deeper power supply-fan unit 46 of blade system 32 may have a lower power supply density for reduced cost.

Connectivity modules 50 comprise self-contained units configured to facilitate connection of each of the plurality of side-by-side computer blades 44 to one or more switches and/or administrative-management circuitry. Each connectivity module 50 facilitates communication between blades 44 of the same blade system 30, 32 as well as communication between blades 44 of different blade systems 30, 32 within computer system 20.

In the example illustrated, connectivity modules 50 is further configured to facilitate communication between one or more blades 44 of blade systems 30, 32 and other non-blade electronic devices such as mass storage device 28. In the example illustrated, connectivity modules 50 provide low-speed, low bandwidth indication between blades 44 and other non-blade electronic component such as mass storage device 28 through electrical lines or cabling 54. Connectivity modules 50 also provide high-speed, high-bandwidth optical communication between blades of the same blade system 30, 32 as well as blades 44 of different blade systems 30, 32 within the same rack. Connectivity modules 50 provide high-speed, high-bandwidth optical communication between blades 44 within rack 22 and blades in other racks.

In the example illustrated, each connectivity module is operationally connected to optical pillar 26 by optical cables, fibers or ribbons 56, whereas optical pillar 26 is optically connected (using optics) to rack switches 24 by optical cables, fibers or ribbons 58. In other embodiments, one or more of connectivity modules 50 may have other configurations. For example, other connectivity modules may not offer each of the above communication avenues.

As shown by FIG. 1, each connectivity module 50 extends perpendicular to the axis along which the major dimension of each of blades 44 extends. Each connectivity module 50 is directly connected to each of a plurality of the side-by-side blades 44 along ends of blades 44, in the example illustrated, each connectivity module 50 includes external openings, wherein one of the openings provides a passage between heat generating components of connectivity module 50 and the adjacent power supply-fan unit 46. As a result, efficient and direct airflow across connectivity modules 50 may be provided by power supply-fan units 46 to cool the heat generating components of connectivity modules 50. Similar to the direct connection between blades 44 and power supply fan units 46, the direct connection between blades 44 and connectivity modules 50 facilitates enhanced cooling airflow and architectural flexibility.

Although FIG. 1 illustrates blades 44 each extending in substantially vertical planes and further illustrates power supply-fan units 46 and connectivity modules 50 horizontally extending across the ends of such blades 44, in other embodiments, these overall orientations may be altered. In particular, in other examples, blades 44 may alternatively extend in substantially horizontal planes, wherein power supply-fan unit 46 and connectivity module 50 vertically extend across the ends of such blades.

Figure 5:
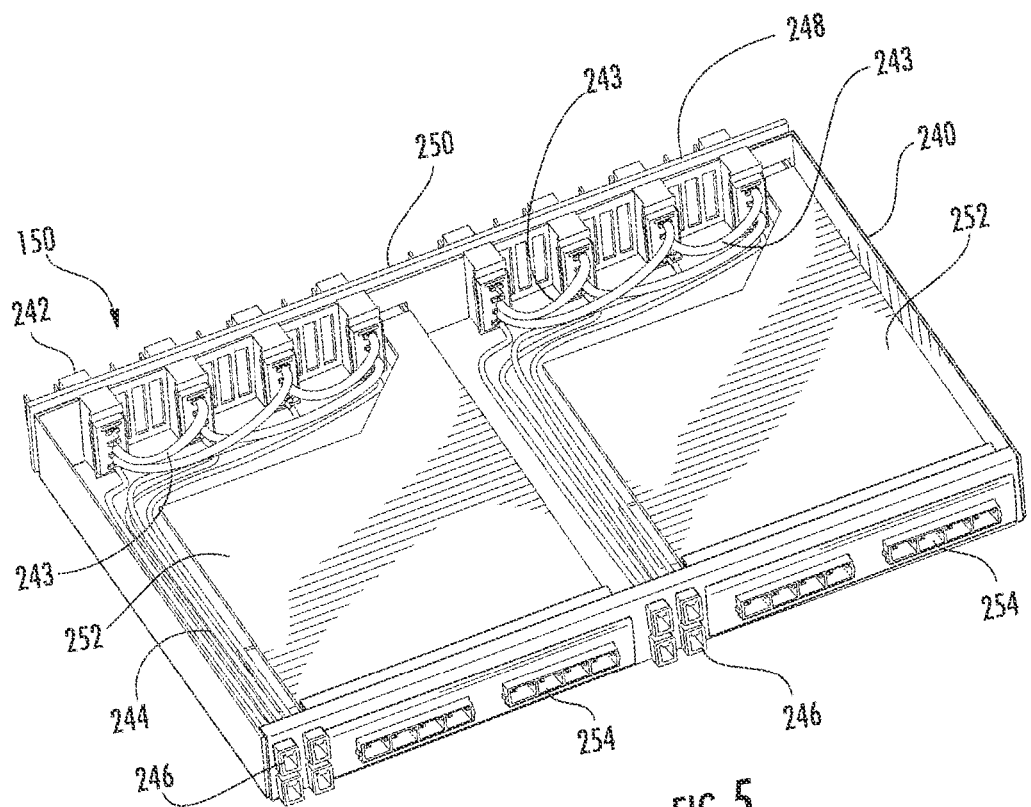
FIG. 5 is a first perspective view of an example connectivity module of the blade system of FIG. 2.
Figure 6:
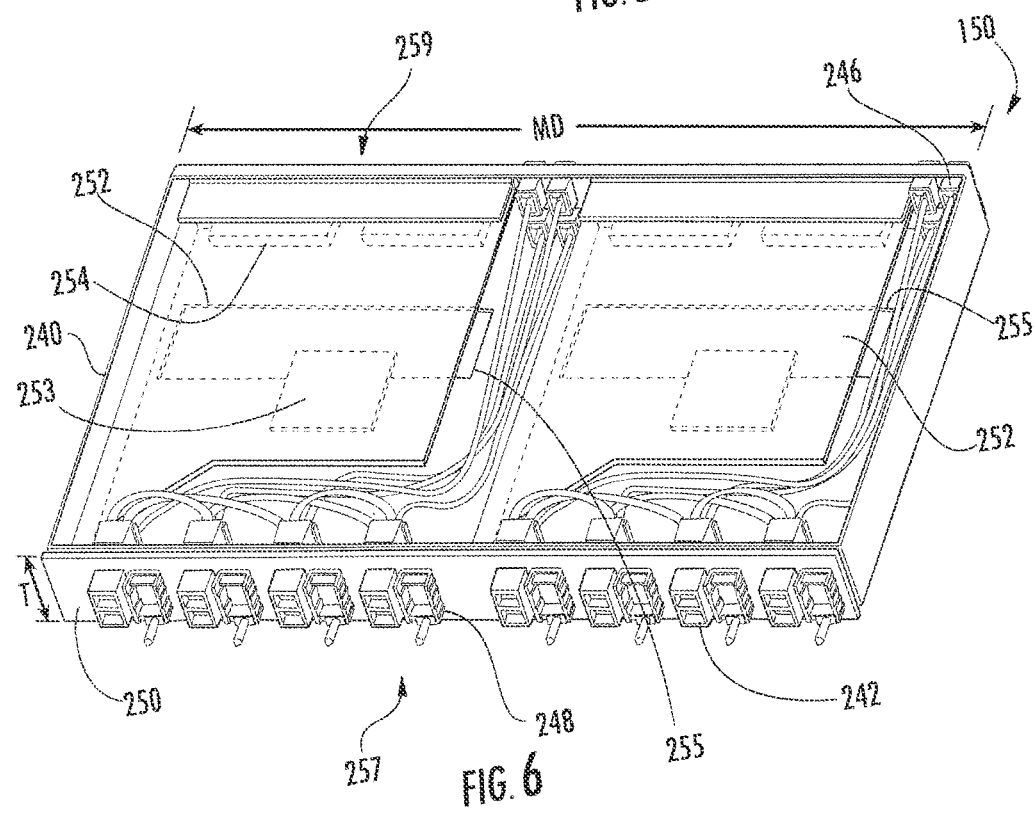
FIG. 6 is a second perspective view of the example connectivity module of FIG. 5.
Figure 7:
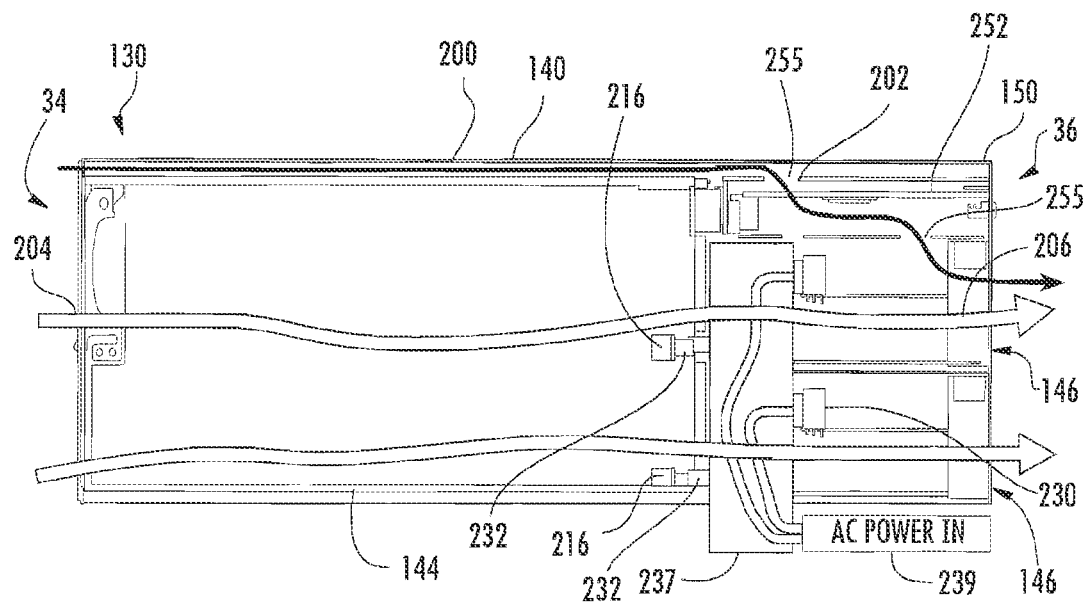
FIG. 7 is a side elevational view of the blade system of FIG. 2 with portions shown transparent to illustrate airflow.

FIGS. 2-8 illustrate blade system 130, one particular example of blade system 30 shown in FIG. 1. Blade system 130 includes blade enclosure 140 (shown in FIG. 7), blades 144A, 144B (collectively referred to as blades 144), power supply-fan units 146A1, 146A2, 146B1 and 146B2 (collectively referred to as power supply-fan unit 146) and connectivity module 150. As shown by FIG. 7, blade enclosure 140 comprises a structure configured to removably mount or be field mountable within rack 22 of supporting or enclosing blades 144, power supply-fan units 146 and at least one connectivity module 150. Enclosure 140 includes one or more vent openings through which air may be drawn through enclosures 40 and one more access panels by which blades 144 may be accessed. As shown by FIG. 7, enclosure 140 forms a fresh air plenum 200 having an opening 202 providing an airflow passage from plenum 200 into connectivity module 150, allowing air to flow from side 34 through plenum 200 and into connectivity module 150. Enclosure 140 further includes air inlet openings 204 at end 34 and air outlet openings 206 at end 36 by which air may enter blade system 34 and exit blade system 36, respectively.

As shown by FIG. 3, blades 144 comprise thin modular electronic circuit boards containing one or more microprocessors and memory. In particular, each blade is a single self-contained computer-motherboard 210 supporting one or more processor(s) 212 (schematically shown) and one or more memories 214 (schematically shown). In other embodiments, the blade 144 may include additional storage or computing components or devices. In the example illustrated, each blade 144 has a width of approximately 9.15 inches, a height (perpendicular to the plane a motherboard 210) of about 1.7 inches and a pitch with respect to other blades 144 of about or 1.75 inches. In other embodiments, blades 144 may have other configurations.

As shown by FIG. 3, each blade 144 further includes power supply connectors 216, electrical connector 218 and optical connector 220. Power supply connectors 216 are electrically connected to motherboard 210 and are supported by blade 144 at locations such that connectors 216 concurrently electrically connect to different power supply-fan units 146 of blade system 130. As a result, each blade 144 has a redundant electrical power architecture, reducing the likelihood that blade 144 will be unpowered when one power supply-fan unit 146 is no longer operable and facilitating repair or exchange of a power supply-fan unit 146. In other embodiments, each blade 144 may alternatively include a single power supply connector 216 for connection to a single power supply-fan unit 146.

Electrical connector 218 comprises a connector connected to motherboard 210 and supported at a location for connection to connectivity module 150. Electrical connector 218 is configured to facilitate the transmission of electrical signals or data signals. In one embodiment, electrical connector 218 provides for lower total bandwidth communication with connectivity module 150.

Optical connector 220 comprises a connector connected to motherboard 210 and supported at a location for connection to connectivity module 150. Optical connector 220 is configured to facilitate the transmission of optical signals or optical data signals. In one embodiment, optical connector 220 provides for high-speed-high-bandwidth communication through optically provisioned fabrics with connectivity module 150. In some embodiments, one connector 218 or 220 may be omitted.

Figure 2:
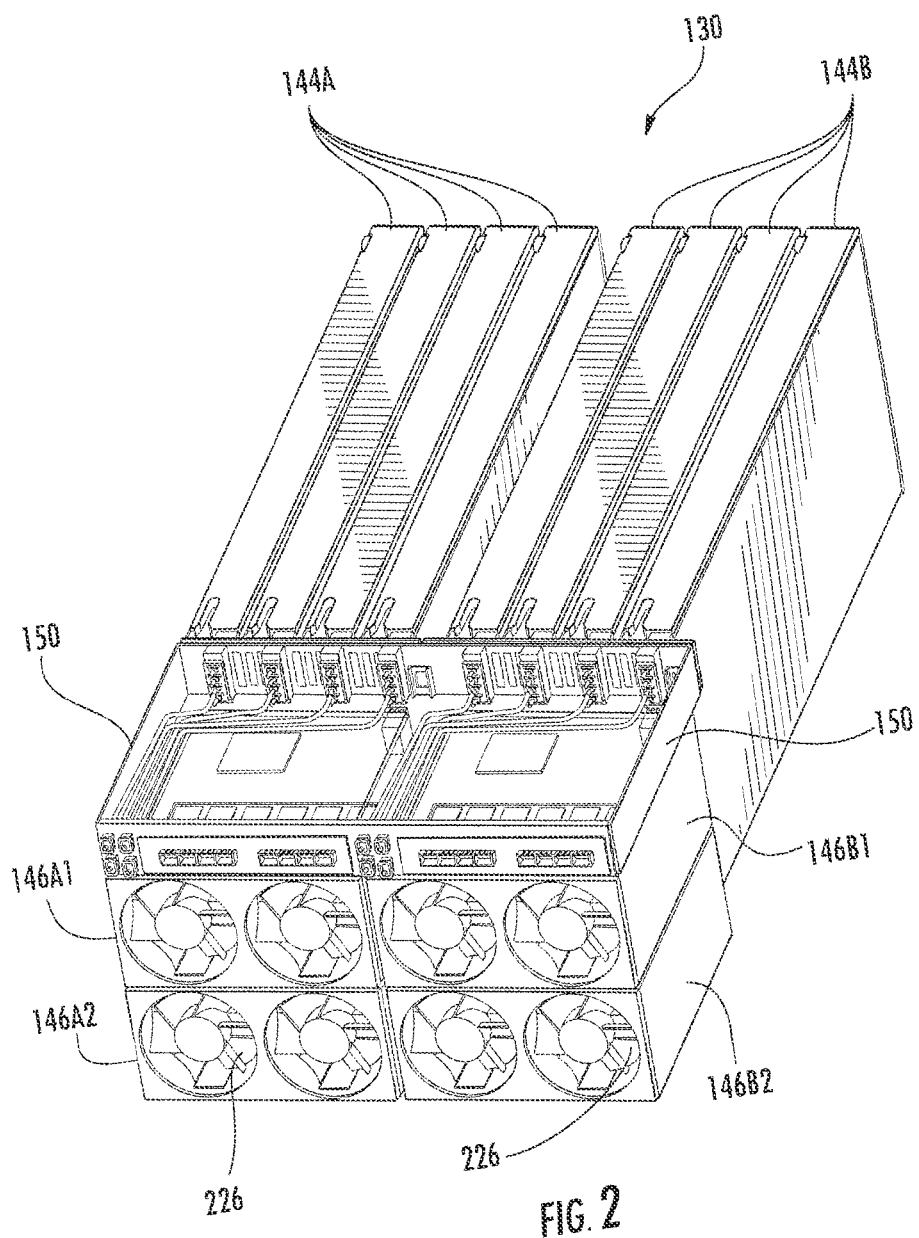
FIG. 2 is a rear perspective view of an example blade system of the computer system of FIG. 1.

Each blade shares one or more power supply-fan units 146. Each of blades 144 also shares at least one connectivity module 150. As shown by FIG. 2, each of the blades 144 of blade system 130 is supported in a side-by-side arrangement such that each of blades 144 is substantially contained in a vertical plane. Blades 144 are further arranged such that each blade has a major dimension (the largest of the three dimensions of each blade) extending along the horizontal axis. Because blades 144 are arranged in a side-by-side arrangement such that their major dimensions extend along a horizontal axis, cooling airflow across such blades in a front to rear direction (from side 34 to side 36) is enhanced.

Power supply-fan units 146 comprise a modules which provide both electrical power and cooling airflow to blade system 130. In particular, each power supply-fan unit 146 provides electrical power to its associated blades 144 and connectivity module 150 contained or supported by the same enclosure 144. FIG. 4 illustrates power supply-fan unit 146A1. As shown by FIG. 4, each of power supply-fan units 146 includes housing 224, motor driven falls 224, power supply 228, power input connector 230 and power output connectors 232. Housing 224 encloses motor driven fans 226 and power supply 228. Housing 224 includes side openings 234 and notch or shelf 236. Side openings 234) provide airflow passages to fans 226, allowing unit to draw air through and from an adjacent connectivity module 150. Shelf 236 provides a space for electrical connection to power and connector 230. In other embodiments, housing 224 may have other configurations.

Motor driven fans 226 are configured to draw air through and across heat generating components of blades 144 and across heat generating components of connectivity module 150 to cool such heat generating components. In particular, fans 226 are configured to draw air from side 34 and discharge air out side 36 of rack 22 (shown in FIG. 1). Power supply 228 comprises circuit board and one or more associated electrical components configured to convert or transform electrical power received from power input connector 230 and converts such received power to appropriate levels are voltages for use by each of blades 144.

Figure 9:
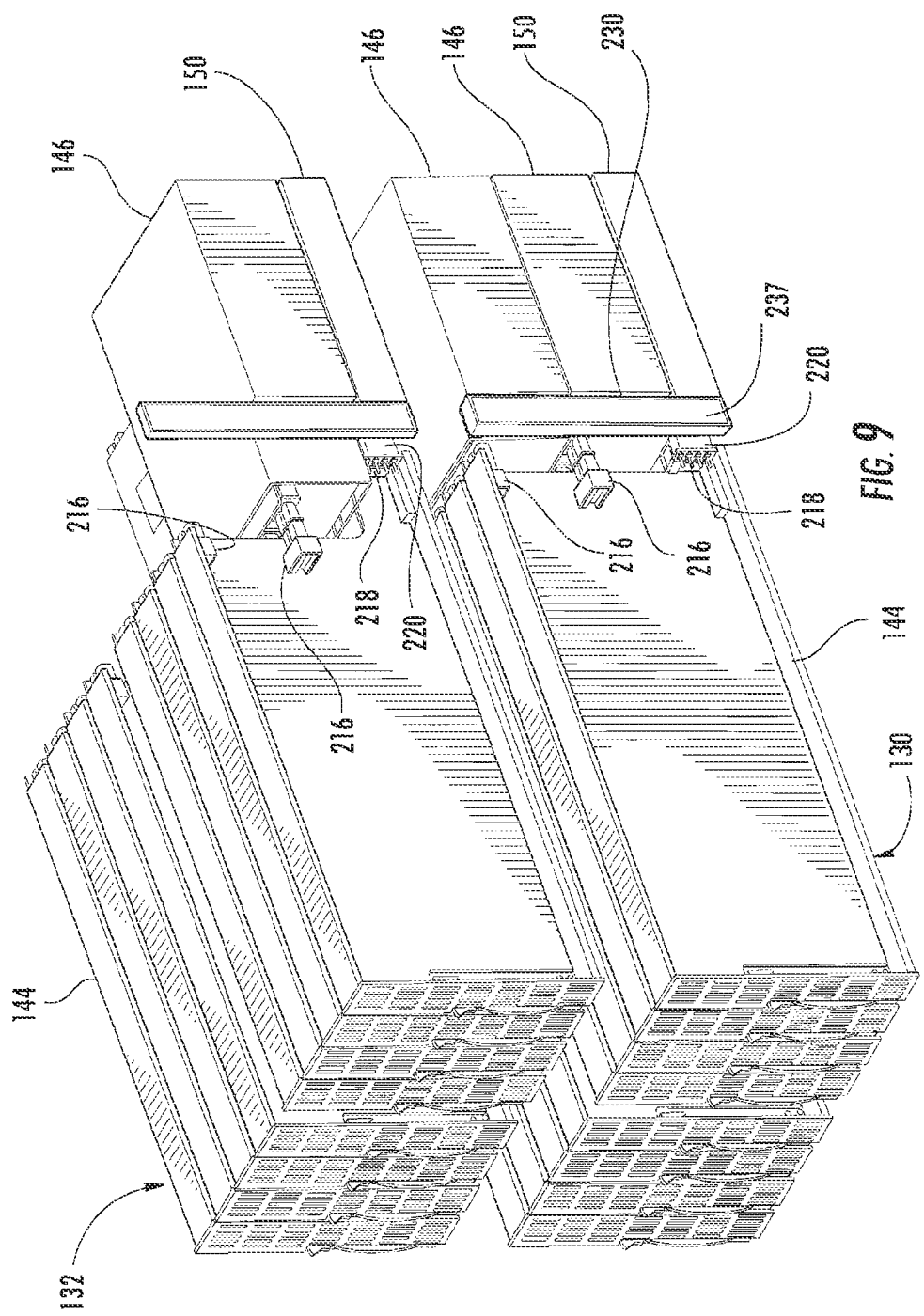
FIG. 9 is a top perspective view of two variations of the example blade system of FIG. 2.

Power input connector 230 comprises an electrical connector above shelf 236 connected to power supply 228 that is configured to electrically connect to a source of electrical power such as an AC power source or supply. As shown by FIG. 9, in the example illustrated, power input connectors for 230 electrically connect to an AC power bus-plate 237 which extends along shelf 236 and which is connected to an AC power source 239 (shown in FIG. 7). Power output connectors 232 comprise electrical connectors which are electrically connected to the printed circuit board of power supply 228 and which are configured to be electrically connected to one of racks 144. The example illustrated, unit 146 includes four connector 232 for supplying power to four blades 144. In other embodiments, unit 146 may include a greater or fewer of such connectors depending upon the number of blades powered by unit 146. In the example illustrated, each of connectors 232 comprises a 12 Volt DC output. In other embodiments, each of connectors 232 may have other configurations.

As shown by FIG. 2, in the example illustrated, blade system 130 includes four power supply-fan units 146 on an axial end of blades 144. Each power supply-fan unit 146 extends perpendicular to the axis along which the major dimension of each of blades 144 extends. Each power supply-fan unit 146 is directly connected to each of a plurality of the side-by-side blades 44 along ends of blades 44 such that each power supply-fan unit 46 draws air across the planar faces of blades 44 and through the fans of unit 44. As will be described in more detail hereafter with respect to FIGS. 7 and 8, cooling airflow across blades 44 is more efficient and direct because each power supply fan unit 46 is directly connected to each of the side-by-side.

In the example illustrated, power supply fan units 146A1 and 146A2 (collectively referred to as units 146A) are each electrically connected to each of blades 144A. Each of blades 144A are connected to unit 146A1 using one of connectors 216 (shown in FIG. 3) and are connected to unit 146A2 using the other of connectors 216. Power supply fan units 146M and 146B2 (collectively referred to as units 146B) are each electrically connected to each of blades 144B. Each of blades 144B are connected to unit 146B1 using one of connectors 216 (shown in FIG. 3) and are connected to unit 146B2 using the other of connectors 216.

Connectivity module 150 comprises a self-contained unit configured to facilitate connection of each of the plurality of side-by-side computer blades 144 to one or more switches and/or administrative circuitry. FIGS. 5 and 6 illustrate connectivity module 150 in more detail. As shown by FIGS. 5 and 6, connectivity module 150 comprises enclosure 240, optical blade connectors 242, blade-to-blade optical fiber interconnects 243, optical fiber lines 244, optical output ports 246, electrical blade connectors 248, electrical midplane 250, printed circuit assemblies 252 and electrical output ports 254. Enclosure 240 comprise a housing, frame or other support enclosing printed circuit assemblies 252 and supporting connector 242, 248, midplane 250 and ports 246, 254. As shown by FIGS. 6 and 7, enclosure 240 includes opposite facial openings 255 to facilitate the flow of air into connectivity module 150 from plenum 200, across connectivity module 150, and into an adjacent power supply-fan unit 146 cool heat generating components of printed circuit assemblies 252. In the example illustrated, enclosure 240 has a major dimension MD substantially equal to the collective major dimensions of the one or more of power supply-fan units 146 and a height or thickness T such that connectivity module 150 may be placed alongside power supply-fan units 146 behind and across blades 144 while providing a continuous substantially planar face along both power supply-fan units 146 and connectivity module 150 for blade system 30. In other embodiments, enclosure 150 may have other configurations.

Optical blade connectors 242 extend through enclosure 240 and are configured for optically connecting to each of blades 144. Optical blade connectors 242 are located along an edge or side 257 of enclosure 240 such that connectivity module 150 may be optically connected to a plurality of different blades. In the example illustrated, connectivity module 150 is configured for use with eight blades. Accordingly, connectivity module 150 includes eight optical connectors 242. In other embodiments, connectivity module 150 may include a greater or fewer of such optical connectors 242.

Interconnects 243 comprise point-to-point processor interconnect directly connected to each of optical blade connectors 242 to facilitate direct optical communication between blades 144. In the example illustrated, each of interconnects 243 comprises a direct CPU-to-CPU coherency domain connection between blades, such as that currently permitted by the Intel QPI (Quick Path Interconnect) specification. In other embodiments, other point-to-point processor interconnects may be utilized or interconnects 243 may be omitted.

Optical lines 244 comprise optical fiber ribbons optically connected to optical connectors 242 at one end and optically connected to optical ports 246 at an opposite end. Optical output ports 246 comprise male or female optical connectors configured to be optically connected to optical lines 56 (shown in FIG. 1). Optical output ports 246 are spaced along an edge or side 259 of enclosure 240 opposite to side or edge 257.

Overall, optical connectors 242, optical lines 244 and optical ports 246 provided optical arrangement configured to facilitate transmission of optical signals from each of blades 144 cross connectivity modules 150 to optical lines 56 and ultimately to racks switches 24. This optical arrangement provides high-speed, high-bandwidth optical communication between blades of the same blade system 30, 32 as well as blades 44 of different blade systems 30, 32 within the same rack. This optical arrangement provides high-speed, high-bandwidth optical communication between blades 44 within rack 72 and blades in other racks.

Electrical blade connectors 248 comprise connectors located along edge 257 of enclosure 240 which are configured to be electrically connected to each of blades 144. In the example illustrated, each of electrical blade connectors 248 electrically connected to electrical midplane 250. In the example illustrated in which connectivity module 150 is utilize 48 blades 144, connectivity module includes eight appropriately located electrical blade connectors 248. In other embodiments, connectivity module 150 include a greater or fewer of such electrical blade connectors 248.

Electrical midplane 250 comprise a printed circuit assembly or printed circuit board support on edge 257 of enclosure 240. Electrical midplane 250 electrically connects each of connectors 248 to each of printed circuit assemblies 252. Because electrical midplane 250 extends along edge 257 of enclosure 240, along the major dimension MD of connectivity module 150, electrical midplane occupies a reduced area along the back of blades 144 so as to provide greater of area for the connection of power supply-fan unit 144 also along the back of blades 144 as well as to reduce any airflow blockage by midplane 250. In the example illustrated, midplane 250 has a height or thickness T of less than or equal to about 1.5 inches.

Printed circuit assemblies 252 comprise circuitry supported by electrical fabric or electrical board electrically connected to midplane 250 and electrical output ports 254. Each printer circuit assembly 252 includes one or more processors 253 and is configured to provide both administrative and switching functions. In particular, each assembly 252 is configured to perform administrative or management functions such as status monitoring of components in each blade 144. Each assembly 252 is further configured to perform switching functions. In other embodiments, each assembly 252 may have greater or fewer of such functions. In the example illustrated, each assembly 252 is redundant with the other such that failure of one assembly 252 may not result in a complete shutdown. In other embodiments, such redundancy may be omitted. In the example illustrated, each printed circuit assembly 252 exports an electrical fabric for management of the enclosure (also known as an onboard administrator management processor) as well as a switched electrical Gigabit Ethernet fabric for interconnection of the blades within the enclosure. In other embodiments, assembly 252 may have other configurations.

Electrical output ports 254 comprise copper cable connectors configured to accept attachment of electrical cables 54 (shown in FIG. 1). In the example illustrated, each connector 254 is shown as a RJ45 copper Ethernet connector. Electrical output ports 254 are spaced along an edge or side 259 of enclosure 240 opposite to side or edge 257.

Overall, electrical output ports 254 facilitate transmission of electrical signals from each of blades 144 through connectivity modules 150 to an array of storage devices such as mass storage device 28 (shown in FIG. 1). This electrical communication arrangement facilitates communication between one or more blades 44 of blade systems 30, 32 and other non-blade electronic devices such as mass storage device 28. Although connectivity module 150 is illustrated as including optical connection to network switch product 24 using optical connector 242, optical lines 244 and optical ports 246, and as including local switching and management functions using electrical connectors 248, printed circuit assemblies 252 and electrical output ports 254, in other embodiments, connectivity module 150 may omit one of the optical or electrical arrangements.

As shown by FIG. 2, each connectivity module 150 extends perpendicular to the axis along which the major dimension of each of blades 144 extends. Each connectivity module 150 is directly connected to each of a plurality of the side-by-side blades 144 along ends of blades 144. Similar to the direct connection between blades 144 and power supply fan units 146, the direct connection between blades 144 and connectivity modules 150 facilitates enhanced cooling airflow and architectural flexibility.

Figure 8:
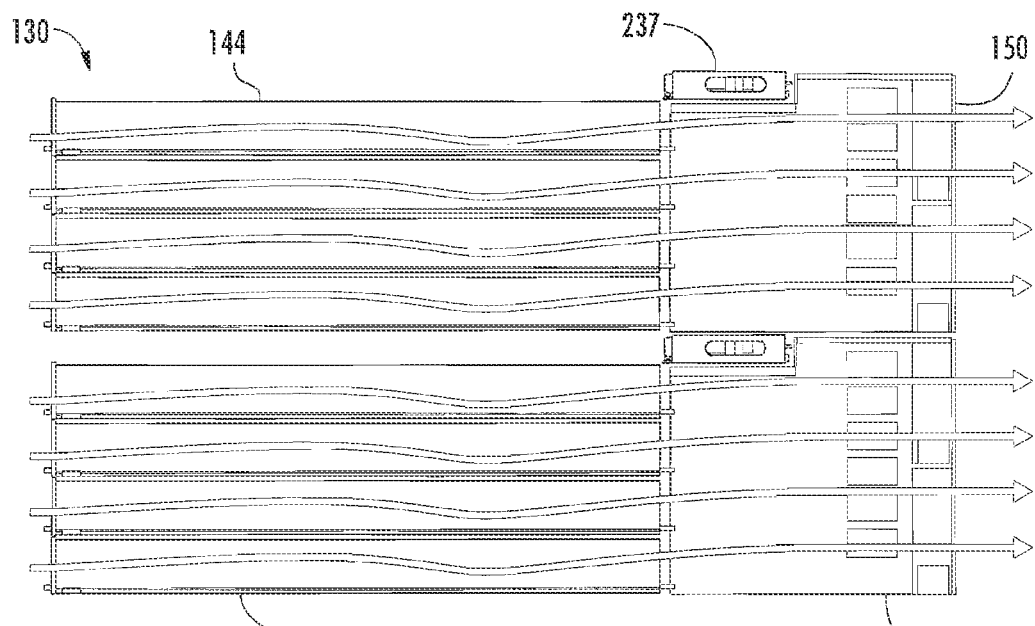
FIG. 8 is atop plan view of the blade system of FIG. 2 with portions shown transparent to illustrate airflow.

FIGS. 7 and 8 illustrate airflow through blade system 130. As shown by FIG. 7, cooling air is drawn by power supply-fan units 146 through plenum 200 through opening 202 an opening 255, across connectivity module 150 and through opening 255 into power supply-fan unit 146 and through fans 226. As shown by FIG. 8, air is drawn by power supply-fan units 146 through vented ends of each of blades 144 and out the open ends of each of blades 144 into the open ends of power supply-fan units 146 and through fans 226.

As shown by FIGS. 7 and 8, airflow across blades 144 is more efficient and direct since there are fewer obstructions or no intervening structures between the one or more power supply fan units 146 and blades 144 about which the air must flow when being drawn by units 146 from side 34 to side 36. For example, air may flow across blades 144 and either into and out of unit 146, or through connectivity module 150 and into and out of unit 146, without the air having to divert its flow path around airflow impeding structures such as electrical midplanes or backplanes having a planar area that spans across multiple blades or that covers or blocks 25% or more of the total area of the airflow openings or gaps at the ends of blades 144 facing units 146.

FIG. 9 illustrates blade system 130 and a portion of blade system 132, another embodiment blade system 32 shown in FIG. 1. Blade system 132 is identical to blade system 30 except for the use of differently sized components facilitated by the architecture of systems 130 and 132. FIG. 9 illustrates the architectural flexibility offered by blade systems 130, 132. Since blades 144 are directly connected to power supply-fan units 146 and because blade systems 130 and 132 each omit a fixed-in-enclosure midplane or backplane, a single enclosure 140 may be used fir differing product families that may have different space needs between blades 144 and connectivity module 150 or different power demands. For example, as with blade system 130, blades 144 may be made deeper with units 146 and connectivity module 150 being made shorter. As with blade system 132, blade 144 may be made shorter with units 146 made longer are deeper. Various combinations of blade, power supply and fan unit 46 and connectivity module 50 can be designed for differing environments (scalable server blades versus storage blades) all of which fit into the same enclosure 40. The shorter blade may lower cost by reducing printed circuit board size, while the same time, allow a deeper power supply and fan unit 146 to be utilized to lower cost by allowing a lower density power supply to be employed.

Figure 10:
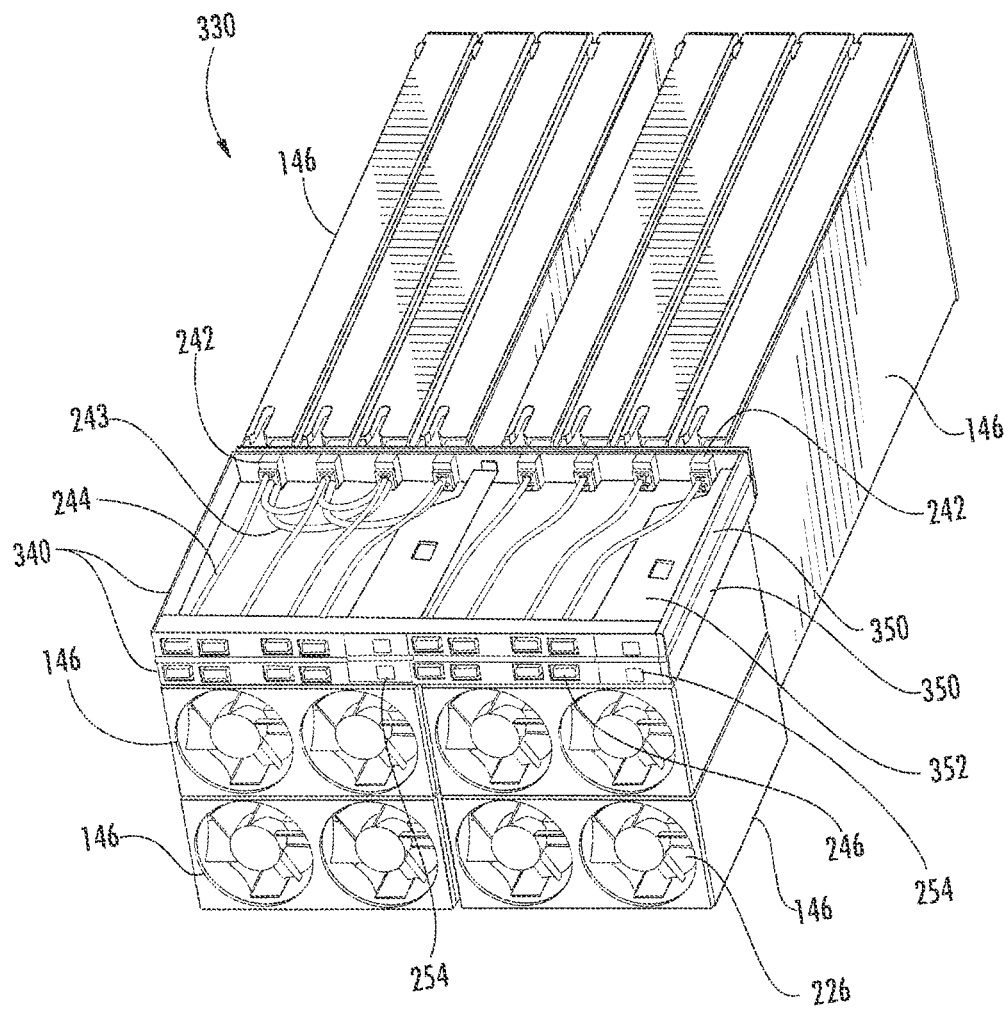
FIG. 10 is a top perspective view of another example embodiment of the blade system of FIG. 2.

FIG. 10 illustrates blade system 330, another embodiment of blade system 130. Blade system 330 is similar to blade system 130 except that blade system 330 includes connectivity modules 350 in place of connectivity module 150. Connectivity modules 350 are similar to connectivity modules 150 except that each connectivity module 350 includes enclosure 340 and printed circuit assembly 352 in place of enclosure 240 and 252, respectively.

Enclosure 340 is similar to enclosure 240 except that enclosure 340 is thinner, approximately one half the height or thickness T of enclosure 240. As shown by FIG. 10, enclosures 340 of connectivity modules 350 are stacked upon one another (or side-by-side depending upon the orientation of blade system 330). Each connectivity module 150 connected to each of the blades 144. Connectivity modules 350 are redundant, allowing one of modules 350 to malfunction or to be removed for replacement or repair without blade system 330 becoming inoperable. In some embodiments, the removal of one of module 350 may result in lower speed or lower bandwidth, but operability is maintained.

Printed circuit assembly 352 is similar to but considerably smaller than printed circuit assembly 252. Printed circuit assembly 352 is smaller since it is merely used for management functions (including administrative-management circuitry) of the enclosure. The dual printed circuit assembly 352 in each connectivity module 350 provide redundancy for continued operation despite failures of one of assembly 352. In the example illustrated, each printed circuit assembly 352 comprises an electric fabric printed circuit assembly. In other embodiments, electrical communication arrangement provided by electrical connectors 248, producer assemblies 352 and electrical ports 254 may be omitted.

Figure 11:
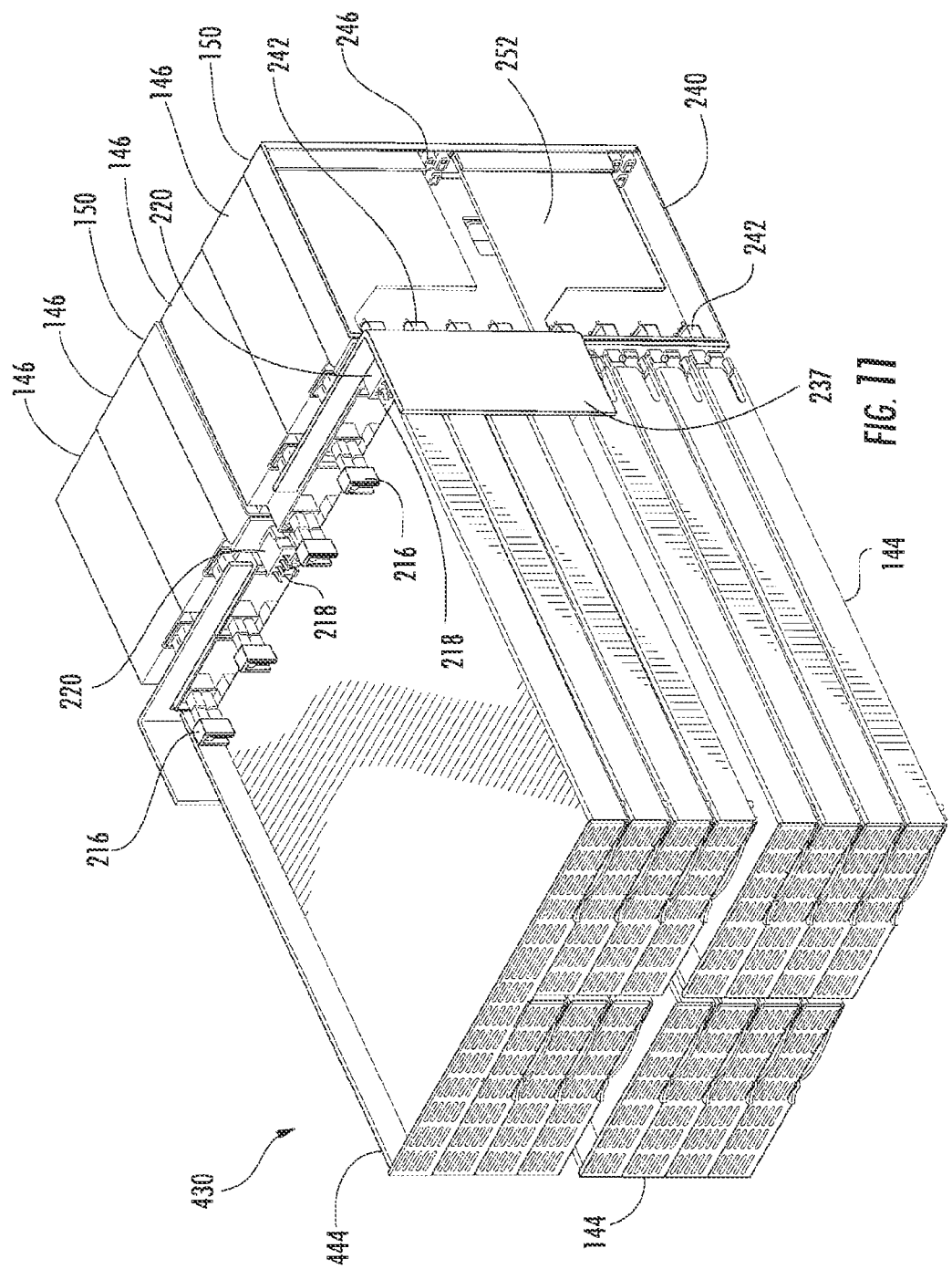
FIG. 11 is a top perspective view of another example embodiment of the blade system of FIG. 2.

FIG. 11 illustrates another example of architectural flexibility provided by the architectural layout and components of blade system 130. FIG. 11 illustrates blade system 430, yet another embodiment of blade system 130 which may be utilized as part of computer system 20 shown in FIG. 1. Blade system 430 comprises two side-by-side blade systems 130 (illustrated rotated 90 degrees from the orientation shown in FIG. 2 for purposes of illustration) with the replacement of two coplanar single-wide blades with a "double-wide" blade 444. The remaining components of blade system 430 which are illustrated and described above with respect to blade system 130 are numbered similarly.

As shown by FIG. 11, blade 444 is similar to blade 144 except that the blade 444 has a width double that of blade 144. Blade 444 also includes four power supply connectors 216 (verse the two power supply connectors 216 in blade 144), two electrical connectors 218 and two optical connectors 220 (versus the single election connector 218 and single optical connector 220 in blade 144). As a result, blade 444 may receive power from one or more of four power supply-fan units 146, and may communicate with one or more of two connectivity modules 150 for enhanced redundancy and potentially enhanced speed or bandwidth. Because blade system 430 omits a fixed-in-enclosure midplane or backplane, the same enclosure 140 may be used for housing or enclosing the components of blade system 430.

Figure 12:
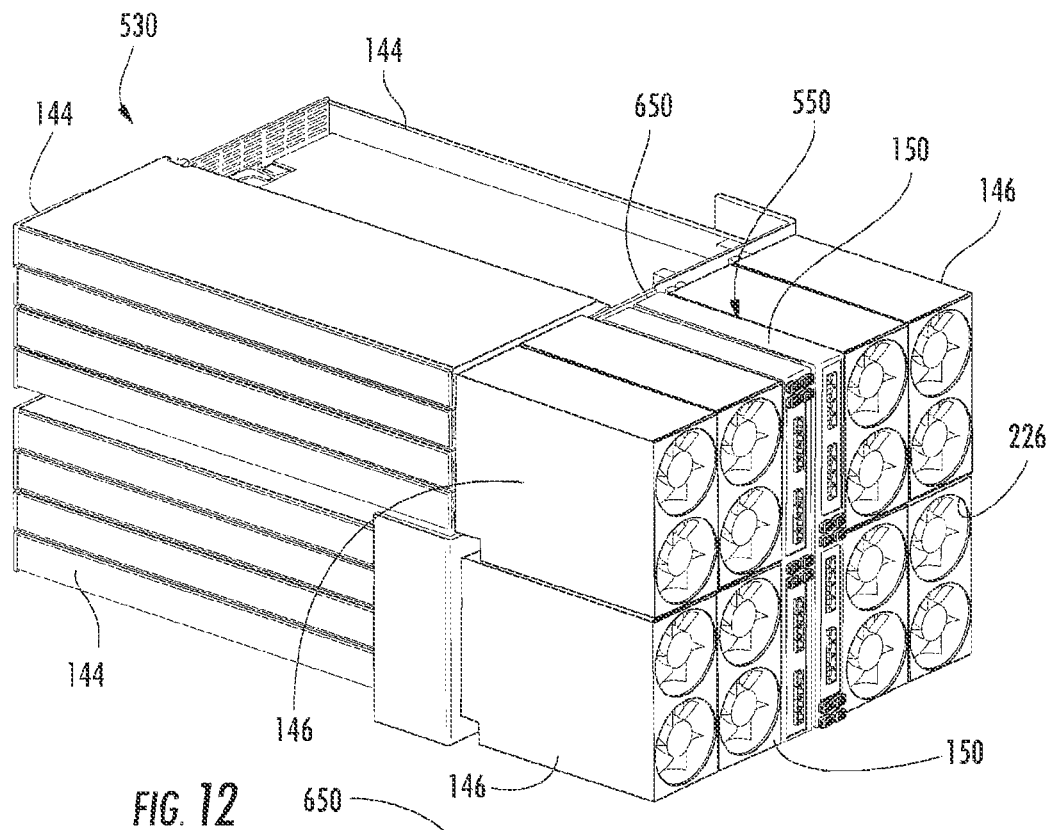
FIG. 12 is a top perspective view of another example embodiment of the blade system of FIG. 2.
Figure 13:
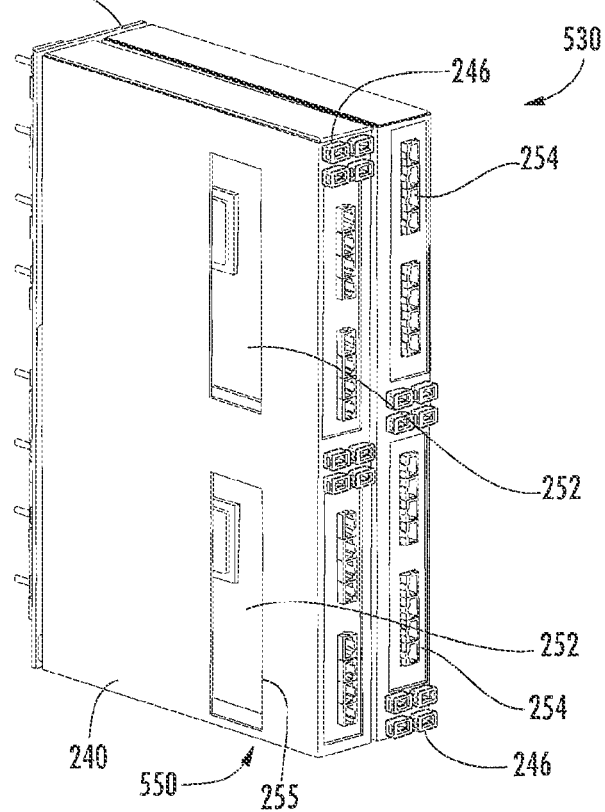
FIG. 13 is a top perspective view of a connectivity, module of the blade system of FIG. 12.

FIGS. 12 and 13 illustrate another example of architectural flexibility provided by the architectural layout and components of blade system 130. FIGS. 12 and 13 illustrate blade system 530, another embodiment of blade system 130 which may be utilized as part of computer system 20 shown in FIG. 1. Blade system 530 comprises two side-by-side blade systems 130 (illustrated as rotated 90 degrees from the orientation shown in FIG. 2 for purposes of illustration) with the replacement of two connectivity modules 150 with a single connectivity module 550. The remaining components of blade system 530 which are illustrated and described above with respect to blade system 130 are numbered similarly.

As shown by FIG. 13, connectivity module 550 comprises two connectivity models 150 joined or attached together except that connectivity module 550 utilizes a single electrical midplane 650 in place of the pair of separate midplanes 250 of the two connectivity modules 150. Midplane 650 is similar to midplanes 150 except that midplane 650 electrically connects electrical connectors 2482 their associated printed circuit assemblies 252 in the two enclosures 240 of the two joined connectivity modules 150. The arrangement shown in FIGS. 12 and 13 facilitates the formation of a blade system 530 including 16 electrically interconnected single-wide blades 144.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A blade computer system comprising:
    a rack;
    a first plurality of side-by-side computer blades within the rack, each computer blade of the first plurality of side-by-side computer blades having a major dimension extending along a first axis;
    a first connectivity module extending across and perpendicular to the first axis across, the first connectivity module spanning the first plurality of side-by-side computer blades and being connected to an end of each computer blade, the first connectivity module to connect each computer blade to switches; and
    at least one first power supply-fan unit extending perpendicular to the first axis, the at least one power supply-fan unit directly connected to the end of each computer blade,
    wherein an airflow path is defined across the first plurality of side-by-side computer blades, into the first connectivity module, and into the power supply-fan unit.

2. The blade computer system of claim 1, wherein the at least one first power supply-fan unit is to create a substantially unidirectional flow along the first axis across the first plurality of side-by-side computer blades and across the first connectivity module.

3. The blade computer system of claim 1 further comprising:
    a second plurality of side-by-side computer blades within the rack, each of the second plurality of side-by-side computer blades having a major dimension extending along the first axis; and
    at least one second power supply-fan unit extending perpendicular to the first axis, the at least one second power supply-fan unit being directly connected to each of the second plurality of side-by-side computer blades along ends of the second plurality of side-by-side computer blades such that the at least one second power supply-fan unit draws air across the second plurality of side-by-side blades and into the first connectivity module;
    wherein each of the at least one first power supply-fan unit has a second dimension along the first axis; and
    wherein the at least one second power supply-fan unit has a third dimension along the first axis greater than the second dimension.

4. The blade computer system of claim 1 further comprising a rack interconnect supported by the rack and including switches,
    wherein the first connectivity module includes:
        an enclosure;
        a plurality of first optical connectors directly connected to each of the first plurality of side-by-side computer blades;
        optical ribbons connected to the first connectors; and
        external optical ports supported by the enclosure, connected to the optical ribbons and optically connected to the rack interconnect.

5. The blade computer system of claim 4, wherein the first connectivity module further includes:
    at least one electrical midplane supported by the enclosure and electrically connected to the first plurality of side-by-side computer blades;
    a first printed circuit assembly within the enclosure and connected to the at least one electrical midplane, the printed circuit assembly including first management circuitry; and
    first external electrical ports supported by the enclosure and connected to the first printed circuit assembly.

6. The blade computer system of claim 5 further comprising:
    a second printed circuit assembly within the enclosure connected to the at least one electrical midplane, the second printed circuit assembly including second management circuitry; and
    second external electrical ports supported by the enclosure and connected to the second printed circuit assembly.

7. The blade computer system of claim 5 further comprising:
    a low total bandwidth device; and
    an electrical connection from the low total bandwidth device to the first external electrical ports of the first connectivity module.

8. The blade computer system of claim 5 further comprising a direct CPU-to-CPU coherency domain connection within the enclosure connecting first and second blades of the first plurality of side-by-side computer blades.

9. The blade computer system of claim 1 further comprising a second connectivity module extending across and perpendicular to the first axis, the second connectivity module extending adjacent the first connectivity module while being connected to the end of each computer blade, the second connectivity module to connect each computer blade of the second plurality of side-by-side computer blades to switches.

10. The blade computer system of claim 9, wherein each of the first connectivity module and the second connectivity module includes:
    an enclosure;
    a plurality of first optical connectors directly connected to each of the first plurality of side-by-side computer blades;
    optical ribbons connected to the first connectors; and
    external optical ports supported by the enclosure, connected to the optical ribbons and optically connected to the rack interconnect.

11. The blade computer system of claim 1, wherein each of the first plurality of side-by-side computer blades is connected to first and second power supplies of the first plurality of power supply-fan units.

12. The blade computer system of claim 1, wherein a first number of the first plurality of side-by-side computer blades is connected to four of the first plurality of power supply-fan units and wherein a second number of the first plurality of side-by-side computer blades is connected to less than four of the first plurality of power supply-fan units.

13. The blade computer system of claim 1, wherein the first connectivity module includes:
    an enclosure;
    at least one electrical midplane supported by the enclosure and electrically connected to the first plurality of side-by-side computer blades;
    a first printed circuit assembly within the enclosure connected to the at least one electrical midplane, the printed circuit assembly including management circuitry; and
    first external electrical ports supported by the enclosure and connected to the first printed circuit assembly.

14. The blade computer system of claim 1, wherein the at least one first power supply-fan unit comprises a plurality of power supply-fan units electrically connected to a same blade of the first plurality of side-by-side computer blades.

15. A method comprising:
    connecting a power supply-fan unit directly to a plurality of side-by-side computer blades along ends of the computer blades;
    connecting a connectivity module directly to ends of the computer blades and positioned to span the plurality of side-by-side computer blades, the connectivity module to connect the computer blades to rack interconnects; and
    drawing air with the power supply-fan unit along an airflow path defined across the plurality of computer blades and into the connectivity module.

* * * * *